United States Patent [19]
Van Zee et al.

[11] Patent Number: 5,357,192
[45] Date of Patent: Oct. 18, 1994

[54] METHOD OF CONTACTING A SEMICONDUCTOR DIE WITH PROBES

[75] Inventors: James C. Van Zee, Phoenix; Gregory L. Westbrook, Chandler, both of Ariz.

[73] Assignee: Motorola, Inc., Schaumburg, Ill.

[21] Appl. No.: 11,576

[22] Filed: Feb. 1, 1993

[51] Int. Cl.$^5$ ............................................. G01R 31/02
[52] U.S. Cl. ..................................... 324/758; 324/73.1
[58] Field of Search .............. 324/158 R, 73.1, 158 P, 324/537, 158 F; 437/8; 439/482; 257/40, 48

[56]   References Cited
U.S. PATENT DOCUMENTS

| | | | |
|---|---|---|---|
| 3,613,001 | 10/1971 | Hostetter | 324/158 P |
| 3,746,973 | 7/1973 | McMahon, Jr. | 324/158 F |
| 3,781,681 | 12/1973 | Wagner et al. | 324/158 P |
| 3,803,483 | 4/1974 | McMahon, Jr. | 324/158 F |
| 4,479,088 | 10/1984 | Stopper | 324/537 |
| 4,486,705 | 12/1984 | Stopper | 324/73.1 |
| 4,523,144 | 6/1985 | Okubo et al. | 324/158 P |
| 4,719,417 | 1/1988 | Evans | 324/158 P |
| 4,947,114 | 8/1990 | Schindlbeck | 324/158 R |
| 5,059,897 | 10/1991 | Aton et al. | 324/158 R |

*Primary Examiner*—Vinh Nguyen

[57]   ABSTRACT

A method of forming a contact between a semiconductor die (10) and a probe (36, 37, 38, 41, 42). The semiconductor die (10) has an integrated circuit region (11) and a bonding pad region (12). A conductive plane (31, 32) couples a bonding pad (16, 17) on one side of the semiconductor die (10) with a bonding pad (16, 17) on an opposite side of the semiconductor die (10). A first probe (41, 42) is positioned a first vertical distance above the conductive plane (31, 32) and a second probe is positioned a second vertical distance above the bonding pad (16, 17) on the semiconductor die (10). The second vertical distance is greater than the first vertical distance. Contacting a portion of the conductive plane (31, 32) with the first probe (41, 42) followed by contacting the bonding pad (16, 17) on the semiconductor die (10) with the second probe (36, 37). The diameter of the first probe (41, 42) is greater than that of the second probe (36, 37).

17 Claims, 1 Drawing Sheet

5,357,192

METHOD OF CONTACTING A SEMICONDUCTOR DIE WITH PROBES

BACKGROUND OF THE INVENTION

This invention relates, in general, to a method of contacting a semiconductor die with a conductor and, more particularly, to a method of temporarily contacting a semiconductor die by means of a probe.

Generally, semiconductor integrated circuit manufacturers electrically test semiconductor die while they are still in wafer form using a testing procedure known as probing. Probing is performed by mating probes to corresponding bonding pads on the semiconductor die. Some of the probes convey input and output signals to and from the semiconductor die while others are coupled to power supply terminals which provide DC voltage signals to the semiconductor die.

Semiconductor die which have a high density of integrated devices also have a plurality of power bonding pads which are coupled to a power supply "power" terminal. Likewise, a plurality of reference bonding pads are included on the semiconductor die which are coupled to a power supply "reference" terminal. The plurality of bonding pads are contacted by probes, wherein at least one probe contacts each bonding pad. The probes contacting the power bonding pads are connected to the power supply "power" terminal, whereas the probes contacting the reference bonding pads are connected to the power supply "reference" terminal.

Using a plurality of bonding pads for coupling to the "power" and "reference" terminals decreases the current density through the probes by distributing the current through a larger area. A major drawback of probing is that it is difficult and tiptoe consuming to determine whether all of the "power" and "reference" bonding pads have been contacted by their corresponding probes. Although a probe test apparatus can readily determine if each signal probe has contacted its respective bonding pad, the same is not true for "power" and "reference" bonding pads because all the "power" probes are electrically connected together and all the "reference" probes are electrically connected. Once one of the "power" or "reference" probes contacts its corresponding bonding pad, it will appear as if all the "power" or "reference" probes have contacted their respective bonding pads.

Thus, if one of the "power" probes does not contact its corresponding bonding pad, the current that should have been supported by the noncontacting "power" probe is distributed to the remaining "power" probes. When several "power" probes do not contact their corresponding bonding pads, the current that they should have supported is redistributed to the "power" probes that do contact their corresponding bonding pads. A consequence of this redistribution is that the current supported by the remaining "power" probes is increased and may exceed the current density rating of the remaining "power" probes, resulting in the failure of these probes.

Accordingly, it would be advantageous to have a method of coupling the power supply output terminals with integrated circuit bonding pads that eliminates probe failures due to high current densities.

SUMMARY OF THE INVENTION

Briefly stated, the present invention comprises a method of contacting a semiconductor die with a probe tip. A semiconductor die is provided wherein the semiconductor die has an integrated circuit region laterally spaced apart from a bonding pad region. At least one bonding pad and at least one conductive plane are formed, wherein the at least one bonding pad is formed in the bonding pad region and the at least one conductive plane extends from the at least one bonding pad towards the integrated circuit region. A probe tip having a first diameter is positioned a first vertical distance above the at least one conductive plane. A probe tip having a second diameter is positioned a second vertical distance above the at least one bonding pad, wherein the second vertical distance is greater than the first vertical distance. The first diameter is greater than the second diameter. The probe tip having the first diameter contacts the at least one conductive plane and the probe tip having the second diameter contacts the at least one bonding pad.

DETAILED DESCRIPTION OF THE DRAWINGS

Figure 1:
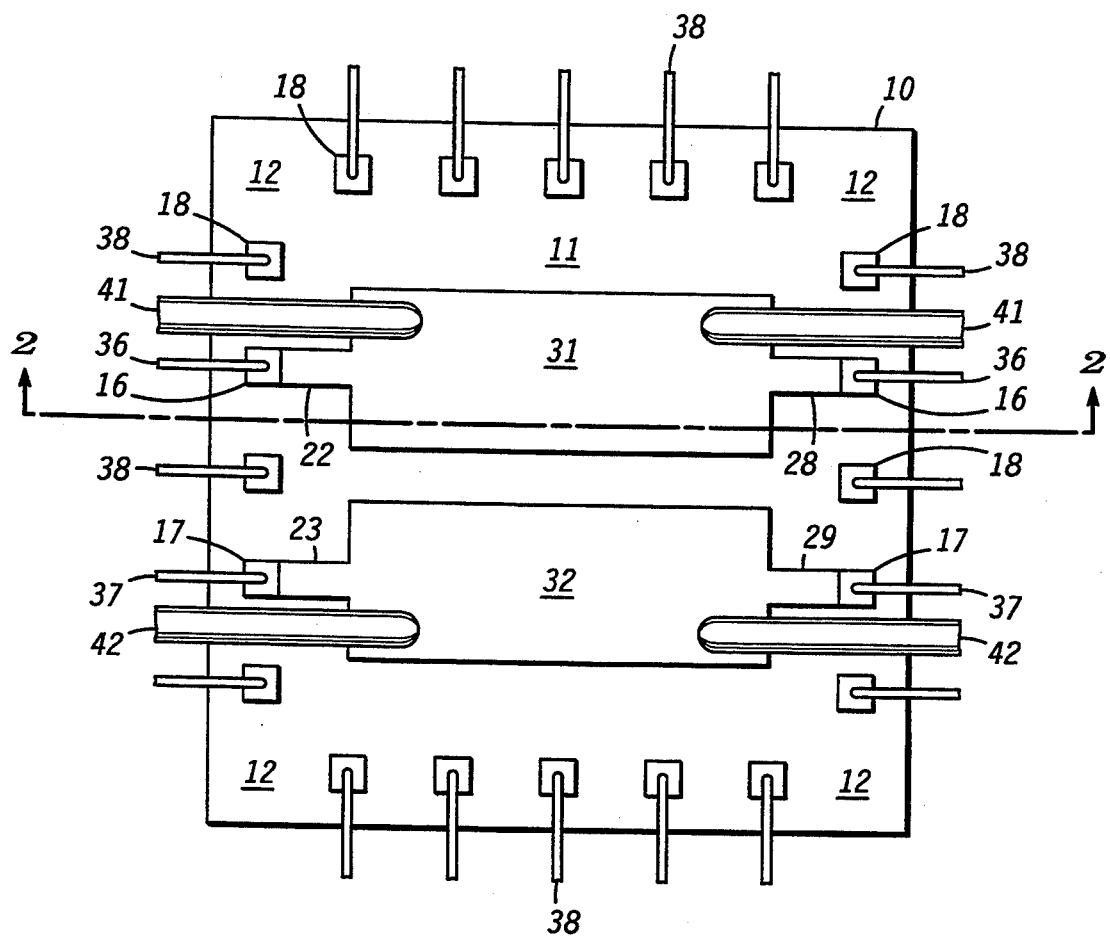
FIG. 1 illustrates a highly simplified top view of a semiconductor die in contact with probes in accordance with the present invention.

FIG. 1 illustrates a highly simplified top view of a semiconductor die 10 in contact with a plurality of probes in accordance with the present invention. Although semiconductor die 10 may be polygonal, it preferably has a substantially rectangular shape having a major surface and comprises an integrated circuit region 11 and a bonding pad region 12. Bonding pad region 12 is located around a periphery of semiconductor die 10 and contains a plurality of contacts or bonding pads 18 disposed on the major surface. Integrated circuit region 11 abuts bonding pad region 12. The plurality of bonding pads serves as a means through which DC and AC electrical signals are received and outputted by semiconductor die 10. Semiconductor die 10 is also referred to as a semiconductor chip. It shall be understood that the semiconductor die may be one semiconductor die of a plurality of semiconductor die that are still in wafer form.

Referring now to bonding pad region 12, bonding pads 16 receive a non-zero DC voltage and are referred to as power bonding pads. In ECL applications the desired voltage delivered to power bonding pads 16 is referred to as $V_{EE}$ and is approximately $-5.2$ volts. In field effect transistor (FET) applications, the desired voltage delivered to power bonding pads 16 is referred to as $V_{DD}$ and is approximately 5 volts. In addition, bonding pads 17 receive a DC voltage and are referred to as reference bonding pads. In ECL applications, the desired voltage delivered to reference bonding pads 17 is referred to as $V_{CC}$. Preferably, $V_{CC}$ is set at approximately 0 volts, which is commonly referred to as a ground potential, thus reference bonding pads 17 serve as ground pads. In FET applications, the desired voltage delivered to reference bonding pads 17 is approximately zero volts. Unlike bonding pads 16 and 17, which receive a substantially constant DC voltage, bonding pads 18 receive or output switching voltage signals that may be AC voltage signals.

It shall be understood that the voltages delivered to power bonding pads 16, reference bonding pads 17, and signal bonding pads 18 may be different when semiconductor die 10 is being tested than when it is in use. For example, during testing of ECL devices all input voltage levels are translated by approximately 2 volts to simplify control of interconnect impedances. Thus, in ECL applications, the first power supply terminal delivers a voltage of approximately −3.2 volts to power bonding pads 16 and the second power supply terminal delivers a voltage of approximately +2 volts to reference bonding pads 17.

In a first embodiment, bonding pads 16, 17, and 18 have a substantially rectangular shape. Power bonding pads 16 on opposite sides of semiconductor die 10 are coupled via a conductive plane 31 and extensions 22 and 28. Reference bonding pads 17 on opposite sides of semiconductor die 10 are coupled via a conductive plane 32 and extensions 23 and 29. In one example of the first embodiment, bonding pads 16, 17, and 18 have a length of approximately 60 micrometers (2.4 mils) and a width of approximately 42 micrometers (1.7 mils) and extensions 22, 23, 28, and 29 have a length of approximately 100 micrometers (3.9 mils) and a width of approximately 42 micrometers (1.7 mils ).

In accordance with the first example of the first embodiment, conductive planes 31 and 32 have widths of approximately 190 micrometers (7.5 mils). Thus, the widths of conductive planes 31 and 32 are greater than the widths of power bonding pads 16 and reference bonding pads 17, respectively. Further, conductive planes 31 and 32 are on the major surface of semiconductor die 10, have a substantially rectangular shape, are substantially parallel to each other, and extend over integrated devices (not shown) in integrated circuit region 11.

It shall be understood that the dimensions for power bonding pads 16, reference bonding pads 17, signal bonding pads 18, and conductive planes 31 and 32 are not limitations of the present invention. However, in accordance with the present invention, the lengths and widths of conductive planes 31 and 32 are greater than the lengths and widths of bonding pads 16, 17, and 18. In other words, the dimensions of power bonding pads 16, reference bonding pads 17, signal bonding pads 18, and conductive planes 31 and 32 may be other than those specified as long as the dimensions of conductive planes 31 and 32 are larger than the dimensions of power bonding pads 16 and reference bonding pads 17, respectively. Bonding pads 16, 17, 18, and conductive planes 31 and 32 may be of, for example, gold, aluminum, copper, a combination thereof, or the like.

Although only one conductive power plane 31 and one conductive reference plane 32 are shown to avoid overcrowding the drawing, it shall be understood that in the first embodiment there may be more than one conductive power plane and more than one conductive reference plane. Moreover, semiconductor die 10 may have a greater or a lesser number of bonding pads 16, 17, and 18 than shown in FIG. 1.

In a second embodiment (not shown), there are two conductive power planes, wherein a first conductive power plane extends from extension 22 towards extension 28 and a second conductive power plane extends from extension 28 towards extension 22. The two conductive power planes have a space or a gap between them. Likewise, there are two conductive reference planes, wherein a first conductive reference plane extends from extension 23 towards extension 29 and a second conductive reference plane extends from extension 29 towards extension 23. The two conductive reference planes have a space or gap between them. Moreover, there may be more than one conductive power plane and more than One conductive reference plane on the major surface Of semiconductor die 10 which extend from other (not shown) power and reference bonding pads.

In a third embodiment (not shown) of semiconductor die 10, conductive power and reference planes extend from all four sides of semiconductor die 10.

Still referring to FIG. 1, portions of probes are shown to be contacting bonding pads 1.6, 17, and 18. Each power bonding pad 16 is contacted by a power probe 36, each reference bonding pad 17 is contacted by a reference probe 37, each signal bonding pad 18 is contacted by a signal probe 38. Further, each end oil conductive plane 31 is contacted by a high current power probe 41, and each end of conductive reference plane 32 is contacted by a high current power probe 42. It shall be understood that the number of high current probes 41 and 42 contacting each power and reference Conductive plane 31 and 32, respectively, may be other than two. In other words, it may be desirable to contact each power and reference conductive plane 31 and 32 with a single high current power and reference probe 41 and 42.

Figure 2:
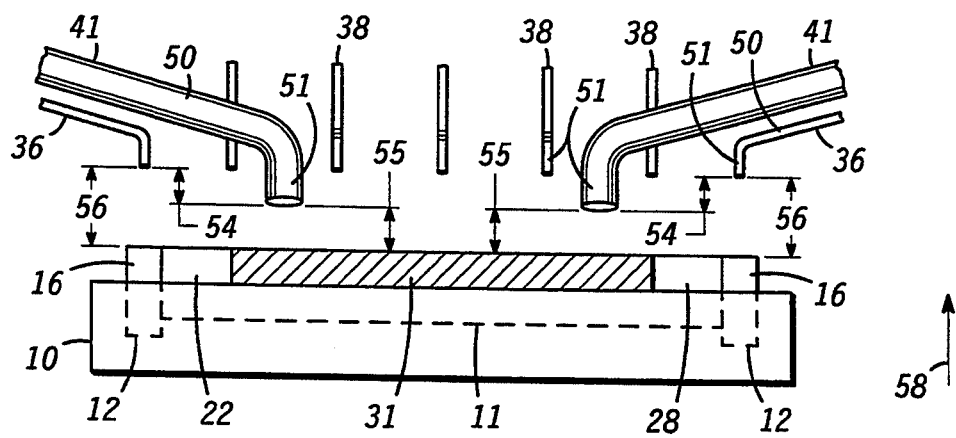
FIG. 2 illustrates a highly simplified cross-sectional side of the semiconductor die and probes along 2—2 of FIG. 1.

FIG. 2 illustrates a highly simplified cross-sectional side view of a portion of semiconductor die 10 along section line 2—2 of FIG. 1. The portion of semiconductor die 10 shown in FIG. 2 includes integrated circuit region 11 and bonding pad region 12, having boundaries denoted by broken lines. Power bonding pads 16, extensions 22 and 28, and conductive plane 31 form a continuous structure as shown in FIG. 2. In addition, FIG. 2 illustrates the locations of power probes 36, high current power probes 41, and signal probes 38.

Each of the plurality of probes has a probe body 50 and an end which serves as a probe tip 51. It is desirable that power probes 36, reference probes 37 (see FIG. 1), and signal probes 38 be cylindrical in shape and have a tapered end which serves as the probe tip 51. Probe bodies 50 are bent near probe tip 51 to facilitate contact with bonding pads on semiconductor die 10. In accordance with the example of the first embodiment, probe bodies 50 of the power probes 36, reference probes 37, and signal probes 38 have a diameter of approximately 38 micrometers (1.5 mils). Further, for conductive planes 31 and 32 having a width of approximately 190 micrometers (7.5 mils), high current power and reference probes 41 and 42, respectively, have a diameter of approximately 127 micrometers (5 mils). The maximum current that will be supported by the probes is calculated from the diameter of the probes as well as the dimensions or size of the area with which the probe tips make contact. For example, the maximum current that can be supported by probes having a diameter of approximately 38 micrometers (1.5 mils) is approximately 330 milliamperes, whereas the maximum current that can be supported by probes having a diameter of approximately 127 micrometers (25 mils) is approximately 1 ampere. The probes may be comprised of beryllium-copper, tungsten, palladium, or the like.

Prior to probing semiconductor die 10, the probes are positioned above their respective bonding pads and conductive planes. This positioning of the probes places the probes in an initial position, hereby defined herein as a home position. In the home position, the probe tips of high current power probes 41 and high current reference probes 42 ( see FIG. 1 ) are separated vertically from the other probe tips by a distance denoted by arrows 54. Moreover, the probe tips of high current power probes 41 and high current reference probes 42 (FIG. 1) are preferably a first vertical distance (indicated by arrows 55) above conductive planes 31 and 32, respectively, while in the home position. In addition, the probe tips of power probes 36, reference probes 37 (FIG. 1), and signal probes 38 are a second vertical distance above power bonding pads 16, reference bonding pads 17, and signal bonding pads 18, respectively, wherein the second vertical distance is indicated by arrows 56.

Typically, wire probe tips such as those embodied in the present invention do not lie in a single plane. Rather, the probe tips lie in a planarity range, wherein the planarity range is approximately 13 micrometers (0.5 mils). In other words, each type of probe tip lies in a range of vertical distances above their respective conductive planes or bonding pads. The maximum vertical separation between any type of probe tip, e.g., high current power probe tips or signal probe tips is within the planarity range. Further, the planarity range of each type of probe tip is much smaller than the vertical separation between the types of probe tips. Thus, to facilitate an explanation of the present invention, the probe tips of the same type e.g., high current power probe tips or the signal probe tips will be considered as being coplanar.

In one example, first vertical distance 55 is approximately 254 micrometers (10 mils) and second vertical distance 56 is approximately 330 micrometers (13 mils). Thus, the vertical separation, i.e., the distance 54, is approximately 76 micrometers (3 mils). It shall be understood that in accordance with the present invention, first vertical distance 55 is less than second vertical distance 56. A result of having first vertical distance 55 less than second vertical distance 56 is that the high current power and reference probes 41 and 42, respectively, contact their respective conductive planes 31 and 32 before the power, reference and signal probes 36, 37, and 38, respectively, contact their respective signal bonding pads 16, 17, and 18. This feature ensures that all the high current power and reference probes 41 and 42, respectively, will be in contact before power, reference, and signal probes 36, 37, and 38 contact their respective bonding pads.

Preferably, power probes 36 and reference probes 37 serve as redundant current conductors which help to lower the current flowing through high current power and reference probes 41 and 42, respectively. However, it shall be understood that power probes 36, reference probes 37, and the bonding pads to which these probes make contact may be replaced by additional signal probes and signal bonding pads when it is desirable to increase the input-output capability of semiconductor die 10.

Contact between the probe tips and their respective bonding pads or conductive planes may be achieved by moving semiconductor die 10 in an upward direction indicated by arrow 58. High current probes 41 contact conductive plane 31. As the upward movement of semiconductor die 10 continues, the tips of high current probes 48 move in both a lateral and a vertical direction. Movement of the probe tips on a conductive plane or a bonding pad is commonly referred to as "scrubbing". Scrubbing helps to ensure contact between the probe tips and a surface with which they are in contact. Typically, lateral movement ! of the probe tips is designed to be approximately one tenth of the vertical movement of the semiconductor die during "scrubbing".

Once the high current probes 41 and 42 contact their respective conductive planes 31 and 32, the upward movement of semiconductor die 10 continues by the amount of the vertical separation 54, thereby allowing contact of the tips of power probes 36, reference probes 37, and signal probes 38, with their respective bonding pads 16, 17, and 18. To ensure adequate contact between the tips of probes 36, 37, and 38 with bonding pads 16, 17, and 18, respectively, semiconductor die 10 is raised an additional amount. The additional amount or distance that semiconductor die 10 is raised is hereby defined herein as overdrive.

The amount of overdrive necessary to provide adequate "scrubbing" is dependent upon the material of probes 36, 37, and 38. For example, a probe comprising beryllium-copper requires an overdrive up to approximately 25 micrometers (1 mil), whereas the overdrive for a probe comprising tungsten is approximately 90 micrometers (3.5 mils).

It shall be understood that movement of semiconductor die 10 towards probes 36, 37, 38, 41, and 42 is not a limitation of the present invention. In other words, probes 36, 37, 38, 41, and 42 may be moved downward rather than moving semiconductor die 10 upward to effect contact between these probes and semiconductor die 10.

By now it should be appreciated that there has been provided a method and probes for contacting a semiconductor die adapted to cooperate with the probes. The present invention provides a method for probe testing semiconductor die which eliminates the occurrence of probe destruction due to high current densities. The present invention takes advantage of high current power and reference probes which have larger diameters than the signal probes as well as conductive planes having larger widths than the bonding pads. Further, the use of larger diameter probe tips enables contact in the integrated circuit region without producing excessive forces that may damage underlying silicon, a phenomenon which may occur with probes having smaller diameters.

In addition, providing conductive planes across the integrated circuit region allows coupling of the conductive planes to nodes within the integrated circuit region that have the same potential as the conductive planes. This coupling helps to distribute the current density thereby improving heat transfer away from the semiconductor die and allowing higher power operating devices.

We claim:

1. A method of contacting a semiconductor die with probes, comprising the steps of:
   providing a semiconductor die having a major surface with a plurality of bonding pads disposed on the major surface adjacent a periphery of the semiconductor die, each of the plurality of bonding pads having a width and a length;
   forming at least one conductive plane on the major surface, the at least one conductive plane having a width which is greater than the widths of each of the plurality of bonding pads;

electrically coupling a first end of the at least one conductive plane with a bonding pad on one side of the semiconductor die and a second end of the at least one conductive plane with a bonding pad on the opposite side of the semiconductor die;

providing a first probe having a first diameter and an end, the end of the first probe positioned a first distance above the conductive plane;

providing a second probe having a second diameter and an end, the end of the second probe positioned a second distance above one of the plurality of bonding pads, wherein the first and second distances are unequal;

contacting the at least one conductive plane with the end of the first probe; and contacting one of the plurality of bonding pads with the end of the second probe.

2. A method of contacting a semiconductor die with probes as claimed in claim 1 wherein the step of providing a semiconductor die includes providing the semiconductor die having at least one bonding pad which serves as a power bonding pad and at least one bonding pad which serves as reference bonding pad.

3. A method of contacting a semiconductor die with probes as claimed in claim 1 wherein the steps of providing at least one conductive plane and electrically coupling the at least one conductive plane comprise the steps of:

providing first and second conductive planes on the major surface, wherein the first conductive plane is spaced apart and electrically isolated from the second conductive plane;

electrically coupling a first end of the first conductive plane with a bonding pad on one side of the semiconductor die and a second end of the firs conductive plane with a bonding pad on the opposite side of the semiconductor die; and electrically coupling a first end of the second conductive plane with another bonding pad on the one side of the semiconductor die and a second end of the second conductive plane with another bonding pad on the opposite side of the semiconductor die.

4. A method of contacting a semiconductor die with probes as claimed in claim 1 wherein the step of providing a second probe includes providing the second probe positioned a second distance above the bonding pad on the one side of the semiconductor die which is electrically coupled to the first end of the at least one conductive plane, the second distance being different than the first distance.

5. A method of forming a contact between a semiconductor die and a probe tip, comprising the steps of:

providing the semiconductor die, wherein the semiconductor die has a major surface, an integrated circuit region extending from a portion of the major surface into a portion of the semiconductor die, and a bonding pad region extending from another portion of the major surface into another portion of the semiconductor die, and wherein the integrated circuit region abuts the bonding pad region;

forming at least one bonding pad on the major surface of the bonding pad region;

forming at least one conductive plane, the at least one conductive plane extending from the at least one bonding pad towards the major surface of the integrated circuit region;

providing at least one probe tip having a first diameter and at least one probe tip having a second diameter, the second diameter less than the first diameter;

positioning the at least one probe tip having the first diameter a first vertical distance above the at least one conductive plane;

positioning the at least one probe tip having the second diameter a second vertical distance above a bonding pad, the second vertical distance being greater than the first vertical distance;

contacting the at least one probe tip having the first diameter with the at least one conductive plane; and contacting the at least one probe tip having the second diameter with the at least one bonding pad.

6. A method of forming a contact between a semiconductor die and a probe tip as claimed in claim 5 wherein the step of forming at least one bonding pad further includes forming a plurality of power bonding pads and a plurality of reference bonding pads.

7. A method of forming a contact between a semiconductor die and a probe tip as claimed in claim 6 wherein the step of forming at least one conductive plane further includes forming a first conductive plane such that the first conductive plane couples a first power bonding pad to a second power bonding pad, and forming a second conductive plane such that the second conductive plane couples a first reference bonding pad to a second reference bonding pad, the first power and reference bonding pads located adjacent one side of the semiconductor die and the second power and reference bonding pads located adjacent an opposite side of the semiconductor die, and the first conductive plane is spaced apart from and electrically isolated from the second conductive plane.

8. A method of forming a contact between a semiconductor die and a probe tip as claimed in claim 7 wherein the first and second conductive planes are substantially parallel to each other.

9. A method of forming a contact between a semiconductor die and a probe tip as claimed in claim 5 wherein the step of providing a semiconductor die includes providing the bonding pad region such that the bonding pad region surrounds the integrated circuit region 10. A method of forming a contact between a semiconductor die and a probe tip as claimed in claim 5 wherein the step of contacting includes moving the semiconductor die towards the at least one probe having the first diameter and the at least one probe tip having the second diameter.

11. A method of forming a contact between a semiconductor die and a probe tip as claimed in claim 5 wherein the step of positioning the at least one probe having the second diameter above a bonding pad includes positioning the at least one probe having the second diameter above the at least one bonding pad from which the conductive plane extends.

12. A probing apparatus and a semiconductor die, the semiconductor die adapted to cooperate with the probing apparatus, comprising:

a semiconductor die, the semiconductor die having a polygonal shape with a plurality of bonding pads located adjacent a periphery of the semiconductor die wherein some of the bonding pads serve as power bonding pads, others of the bonding pads serve as reference bonding pads, and yet others of the bonding pads serve as signal bonding pads, and the semiconductor die further having at least one conductive plane disposed thereon which couples at least one bonding pad adjacent one side of the semiconductor die with at least one bonding pad adjacent another side of the semiconductor die, the at least one bonding pad adjacent the one side of the semiconductor die selected from the group of power bonding pads, reference bonding pads, or signal bonding pads and the at least one bonding pad adjacent the another side of the semiconductor die selected from the respective group of power bonding pads, reference bonding pads, or signal bonding pads;

a first probe having an end, wherein the end serves as a probe tip for mating with the at least one conductive plane disposed on the semiconductor die, the first probe having a first diameter; and a second probe having an end, wherein the end serves as a second probe tip for mating with one of the plurality of bonding pads, the second probe having a second diameter which is different from the first diameter of the first probe, and wherein the second probe tip is in a different vertical plane than the first probe tip when the first and second probe tips are not in contact with the at least one conductive plane and the one of the plurality of bonding pads, respectively.

13. A probing apparatus and a semiconductor die as claimed in claim 12 wherein the diameter of the first probe is approximately 127 micrometers (5 mils) and the diameter of the second probe is approximately 38 micrometers (1.5 mils).

14. A probing apparatus and a semiconductor die as claimed in claim 12 wherein the bonding pad adjacent the one side and the bonding pad adjacent the another side of the semiconductor die are power bonding pads.

15. A probing apparatus and a semiconductor die as claimed in claim 12 wherein the bonding pad adjacent the one side and the bonding pad adjacent the another side of the semiconductor die are reference bonding pads.

16. A probing apparatus and a semiconductor die as claimed in claim 12 wherein the second probe tip is positioned to contact the bonding pad adjacent the one side of the semiconductor die which is coupled by the at least one conductive plane with a bonding pad adjacent the another side of the semiconductor die.

17. A probing apparatus and a semiconductor die as claimed in claim 12 wherein the second probe tip is positioned to contact one of the bonding pads which serves as a signal bonding pad.

* * * * *